United States Patent
Uoya

(10) Patent No.: US 7,859,097 B2
(45) Date of Patent: Dec. 28, 2010

(54) SEMICONDUCTOR DEVICE AND METHOD OF FABRICATING SEMICONDUCTOR DEVICE

(75) Inventor: Kousaku Uoya, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 12/285,744

(22) Filed: Oct. 14, 2008

(65) Prior Publication Data

US 2009/0102042 A1    Apr. 23, 2009

(30) Foreign Application Priority Data

Oct. 18, 2007    (JP)    ............... 2007-271178

(51) Int. Cl.
*H01L 21/302* (2006.01)
*H01L 23/48* (2006.01)

(52) U.S. Cl. ................. 257/690; 257/787; 257/E23.01; 257/E21.214; 438/460

(58) Field of Classification Search ................. 257/690, 257/787, 724, 701, 712, E23.01, E21.214, 257/E23.062, E23.07
See application file for complete search history.

(56) References Cited

U.S. PATENT DOCUMENTS

| | | | | |
|---|---|---|---|---|
| 5,708,304 | A * | 1/1998 | Tomita | ................. 257/778 |
| 7,250,354 | B2 | 7/2007 | Uchida | |
| 2001/0033016 | A1 | 10/2001 | Sumikawa et al. | |
| 2006/0049488 | A1 | 3/2006 | Uchida | |
| 2006/0249853 | A1 | 11/2006 | Sumikawa et al. | |
| 2007/0108636 | A1 * | 5/2007 | Andoh | ................. 257/787 |
| 2007/0278678 | A1 | 12/2007 | Uchida | |

FOREIGN PATENT DOCUMENTS

| | | |
|---|---|---|
| JP | 2001-230224 | 8/2001 |
| JP | 2006-80284 | 3/2006 |

* cited by examiner

*Primary Examiner*—Sue Purvis
*Assistant Examiner*—Whitney Moore
(74) *Attorney, Agent, or Firm*—McGinn Intellectual Property Law Group, PLLC

(57) ABSTRACT

A semiconductor device including a semiconductor chip having external connecting terminals formed on one side is restrained to cause chipping in ridge line portion of semiconductor chip. A cover layer 103 is formed on the other side of the semiconductor chip 102. At least a part of an end portion 106 of the cover layer is outside of the ridge line portion 107 of the semiconductor chip.

8 Claims, 10 Drawing Sheets

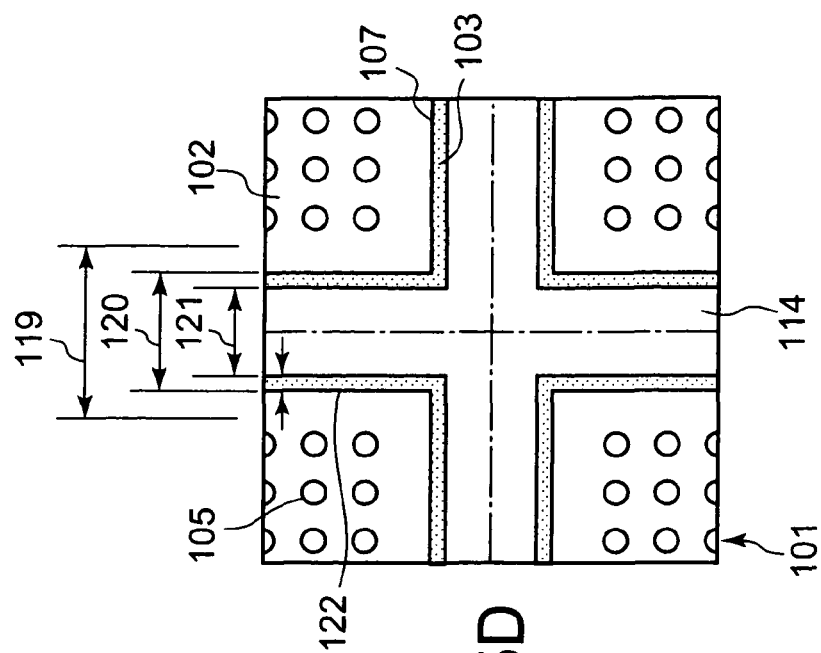
FIG. 5D
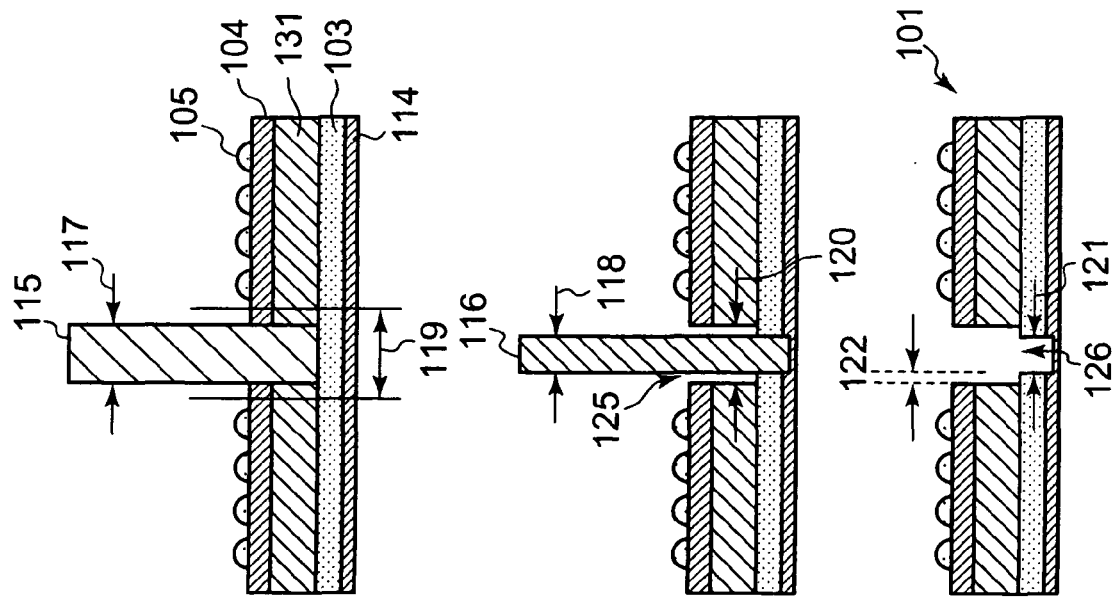
FIG. 5A
FIG. 5B
FIG. 5C

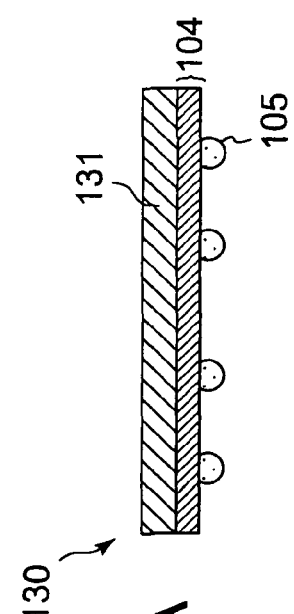
FIG. 7A
FIG. 7B
FIG. 7C
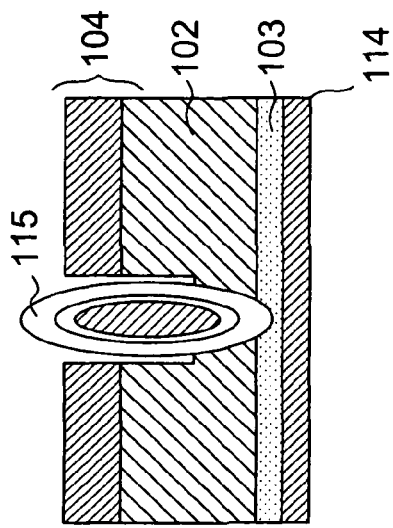
FIG. 7D
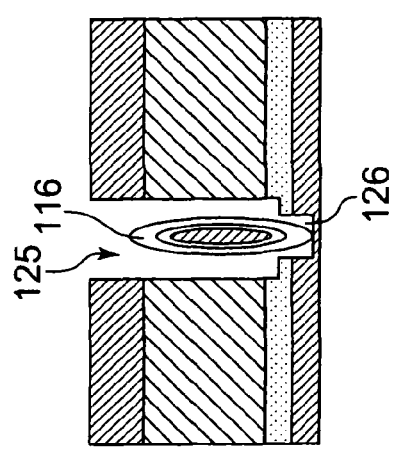
FIG. 7E
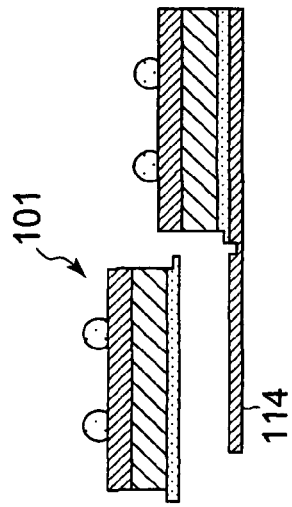
FIG. 7F

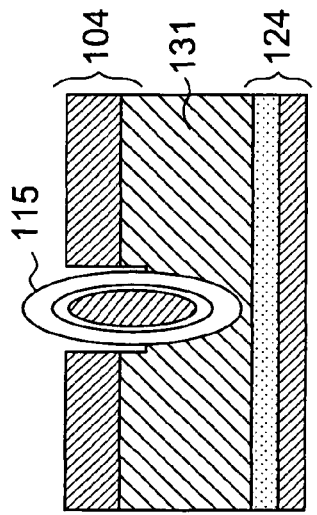
FIG. 10A
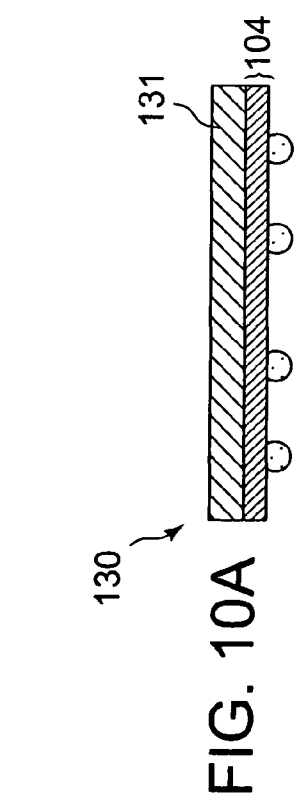
FIG. 10B
FIG. 10C
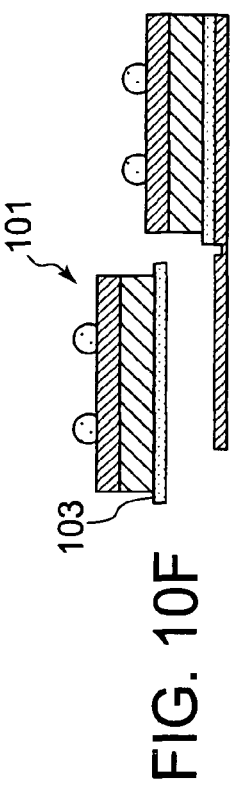
FIG. 10D
FIG. 10E
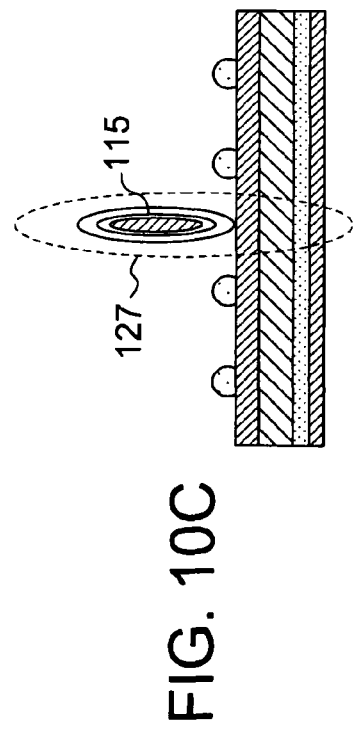
FIG. 10F

SEMICONDUCTOR DEVICE AND METHOD OF FABRICATING SEMICONDUCTOR DEVICE

BACKGROUND OF THE INVENTION

1. Field of the Invention

The present invention relates to a semiconductor device and a method of fabricating a semiconductor device.

2. Description of the Related Art

Trend for high integration on electronic devices has stimulated development of a semiconductor device (semiconductor package) such as a WLBGA (Wafer Level Ball Grid Array) including an external connecting terminal on one side and having approximately the same external dimensions as a semiconductor chip to be mounted. Otherwise, the WLBGA is occasionally called as Wafer Level Chip Size Package.

Such a semiconductor device is normally structured to expose one side (a side where a silicon substrate is formed) of semiconductor chips. Therefore, application of external force, for example, due to handling during an inspection step and an packaging step occasionally causes chipping such as cracking and breaking in ridge line portions of a semiconductor chip. In the present specification, an end portion of one side of a semiconductor chip (for example, a ridge line portion 107 in FIG. 1) will be called a ridge line portion. A silicon piece generated by relevant chipping is adhered to a wiring layer and another semiconductor chip to cause deterioration in electrical property such as short circuit between mutual wirings, resulting in failure.

Japanese Patent Laid-Open No. 2006-80284 discusses technology for avoiding such a problem. As FIG. 11 illustrates, a semiconductor device 10 consists of a semiconductor chip 11 and external connecting terminals 13 over sealing resin 12. A chamfer portion 14 is formed in an end of the semiconductor chip 11. The chamfer portion 14 is intended to restrain occurrence of chipping during handling.

The object of Japanese Patent Laid-Open No. 2001-230224 is different. However, in order to improve strength of an entire semiconductor device against bending deformation, resin 15 with the same area as the area of the relevant semiconductor chip 11 is provided in structure on the semiconductor chip 11 and on the opposite side of the external connecting terminals 13 formed on a circuit surface 16 as in FIG. 12.

SUMMARY

The prior arts in Japanese Patent Laid-Open No. 2006-80284 and Japanese Patent Laid-Open No. 2001-230224 still required improvement as follows.

For Japanese Patent Laid-Open No. 2006-80284, the semiconductor chip 11 is provided with the chamfer portion 14 at its end portion. However, since the ridge line portion 17 (the relevant two sites specified by arrows in the present specification are also in the ridge line portion) of the semiconductor chip 11 is exposed, external force is occasionally applied to the relevant portion, in particular, at the occasion of handling from one side (silicon substrate forming side) of a semiconductor device. Therefore, chipping still occasionally occurs. For Japanese Patent Laid-Open No. 2001-230224, resin 15 is formed on the semiconductor chip 12. Therefore, the relevant resin 15 is considered to effectively restrain application of external force at handling to the upper surface of the semiconductor chip 12. However, the ridge line portion 17 of the semiconductor chip 12 being apt to cause chipping is exposed in structure and external force is occasionally applied to the relevant portion during the above described handling. Therefore, restraint against chipping in a semiconductor chip still requires improvement.

As described above, the prior arts cannot restrain occurrence of chipping in a ridge line portion of a semiconductor chip due to application of external force, for example, at handling.

The present invention provides a semiconductor device comprising a semiconductor chip having external connecting terminals formed on one side, wherein cover layer is formed on the other side of the semiconductor chip and at least a part of end portion of the cover layer is outside of ridge line portion of the semiconductor chip.

In addition, the present invention provides a method of fabricating a semiconductor device from a semiconductor wafer, providing external connecting terminals on one side of the semiconductor wafer, and providing a cover layer on the other side of the semiconductor wafer, comprising: forming a groove with a first width from the one side to, at least, an interface between the semiconductor wafer and the cover layer in the semiconductor wafer; and cutting the cover layer with a second width from the bottom side of the groove, wherein the second width is narrower than the first width.

In the present invention, in a semiconductor device including a semiconductor chip having external connecting terminals formed on one side, at least a part of cover layer formed on the other side of the semiconductor chip is outside of ridge line portion of the semiconductor chip. Therefore, at the occasion of handling, the ridge line portion of a semiconductor chip will no longer directly contact to, for example, a jig for handling. Since the ridge line portion of the semiconductor chip is protected, occurrence of chipping can be restrained.

The present invention can provide a semiconductor device including a semiconductor chip having external connecting terminals formed on one side, wherein occurrence of chipping in ridge line portions of the semiconductor chip is restrained. The present invention can also provide a method of fabricating the semiconductor device.

BRIEF DESCRIPTION OF THE DRAWINGS

FIGS. 5A to 5D are schematic diagrams of a process flow related to the first embodiment of the present invention;

FIGS. 7A to 7F are cross-sectional schematic diagrams of a process flow related to the second embodiment of the present invention;

FIGS. 10A to 10F are cross-sectional schematic diagrams of a process flow related to a fourth embodiment of the present invention;

DETAILED DESCRIPTION OF THE PREFERRED EMBODIMENTS

First Embodiment

Figure 1:
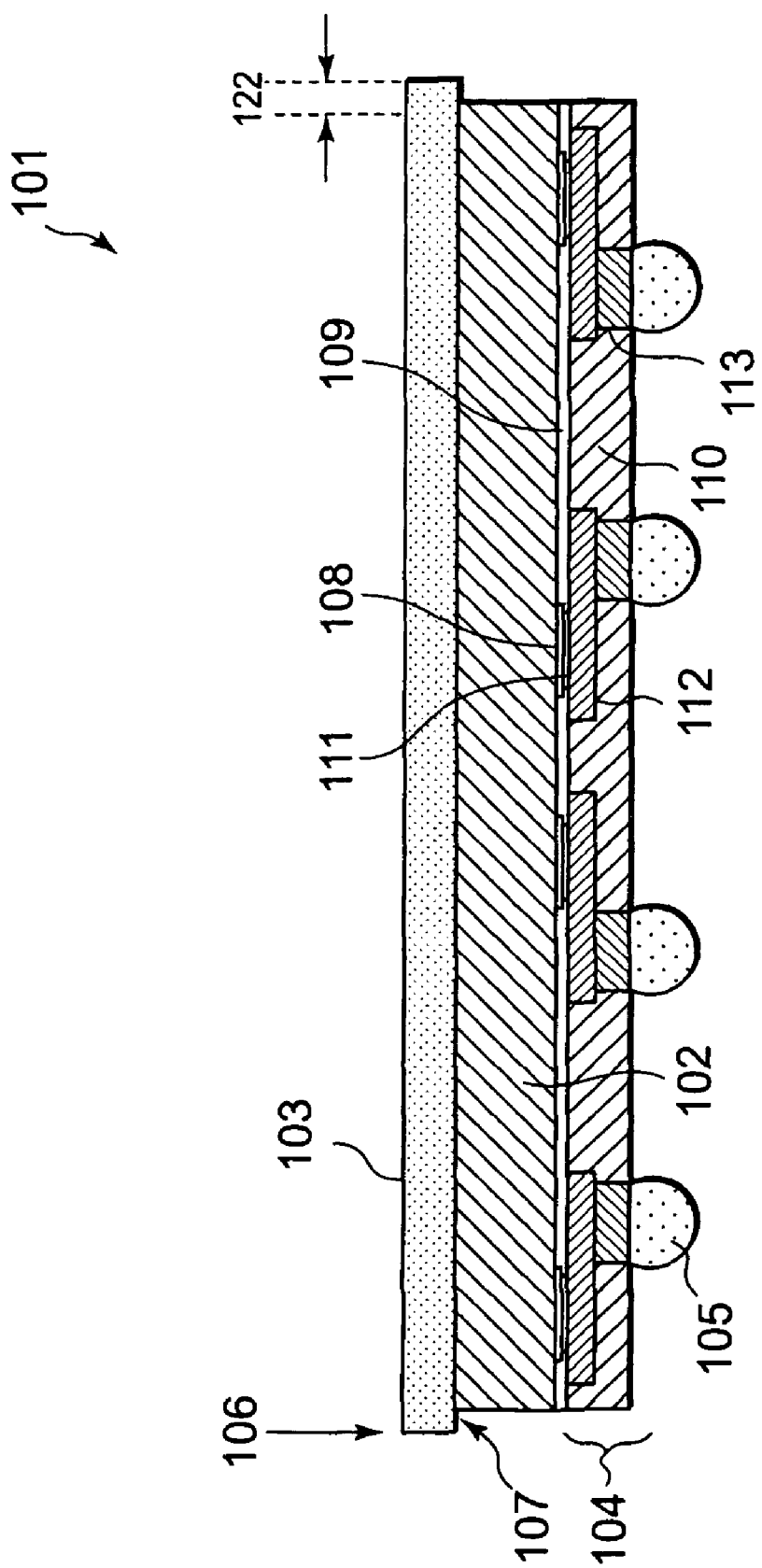
FIG. 1 is a cross-sectional schematic diagram of a semiconductor device related to a first embodiment of the present invention.
Figure 2:
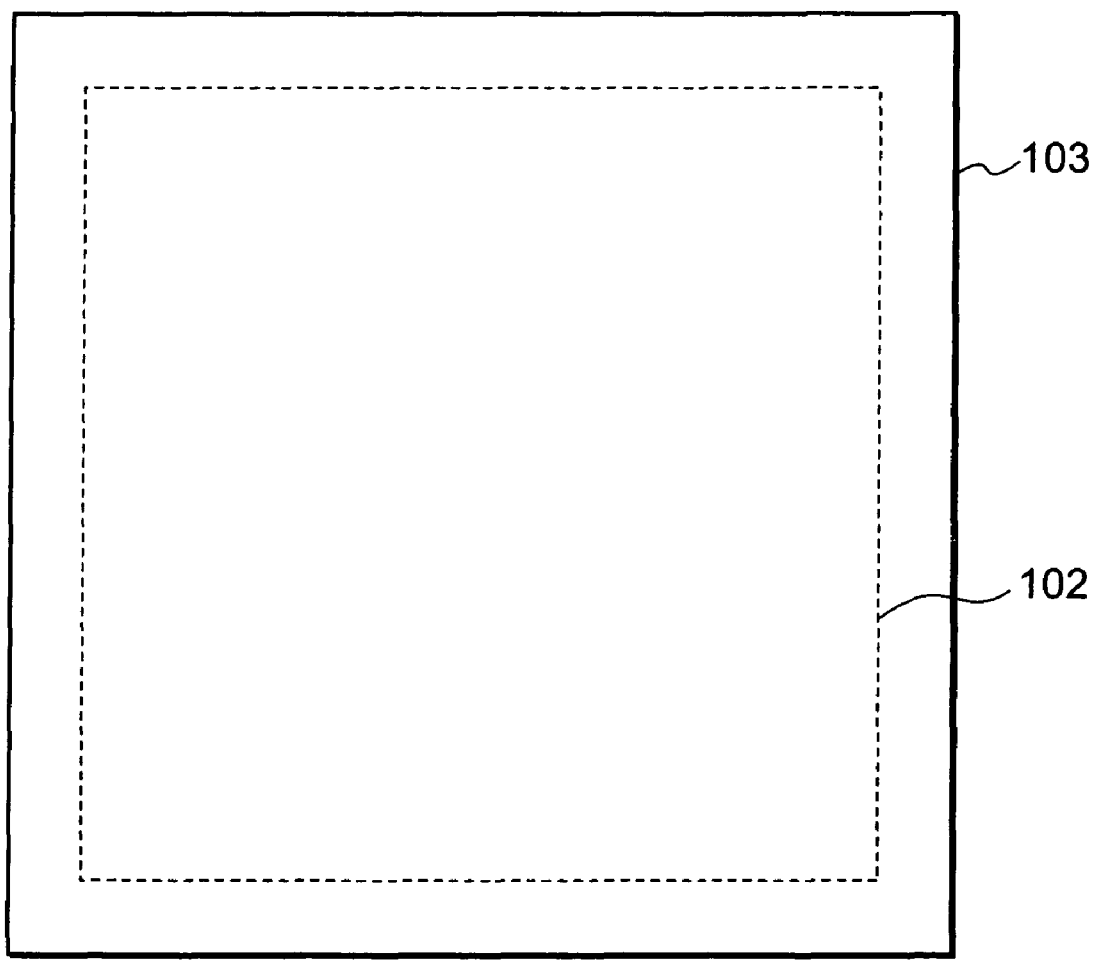
FIG. 2 is a plan schematic diagram of a semiconductor device related to the first embodiment of the present invention.

FIG. 1 is a cross-sectional schematic diagram of a semiconductor device for describing a first embodiment of the present invention. FIG. 2 is a plan view thereof.

As FIG. 1 illustrates, a semiconductor device 101 includes a semiconductor chip 102, a cover layer 103, a wiring layer 104 and external connection terminals 105. As FIG. 1 and FIG. 2 illustrate, the end portion 106 of the cover layer is outside of the ridge line portion 107 of the semiconductor chip. A protruding portion 122 of the cover layer will not be limited in particular but can be not more than around thickness of the used semiconductor chip 102. For example, the protruding portion 122 can be around 7.5 µm as described below. Thickness of the cover layer 103 is not limited in particular but can be not more than around a half the thickness of the semiconductor chip 102, for example, 50 µm. A resin layer and a tape layer, for example, can be used as the cover layer 103.

Solder balls 105 are formed as external connecting terminals on one side (lower side in FIG. 1) of the semiconductor device 101. The solder balls 105 are electrically connected to bonding pads 108 on the surface of the semiconductor chip 102 through the wiring layer 104 formed on one side of the semiconductor chip 102. In structure, the wiring layer 104 can include a first insulating layer 109 (made of polyimide), a second insulating layer 110 (made of resin), UBM (Under Bump Metal) 111, wirings 112 and posts 113 as FIG. 1 illustrates. The wirings 112 and the posts 113 can be made of Cu and stacked film made of Ti/Cu can be used as the UBM 111. In the present embodiment, the bonding pads 108 on the surface of the semiconductor chip 102 are connected to the external connection terminals 105 through the wiring layer 104 but, in structure, the direct connection thereof can be adopted. FIG. 2 is a plan diagram taken from the side where the cover layer 103 is formed. FIG. 2 illustrates only the cover layer 103 and the semiconductor chip 102. Description on the components such as the other wiring layers and solder balls is omitted.

In the present embodiment, the end portion 106 of the cover layer is formed on the other side of the semiconductor chip 102 and is outside of the ridge line portion 107 of the semiconductor chip. Therefore, at handling from the other side of the semiconductor chip 102, the ridge line portion 107 of the semiconductor chip will no longer directly contact to, for example, a jig (not illustrated in the drawing) for handling. Protection of the ridge line portion 107 of the semiconductor chip enables restraint of occurrence of chipping. In the present embodiment, the cover layer 103 protrudes outward along four sides of the semiconductor chip 102 as FIG. 2 illustrates. However, the protrusion can be provided only in any one of the sides or in an arbitrary site (one part).

Figure 3:
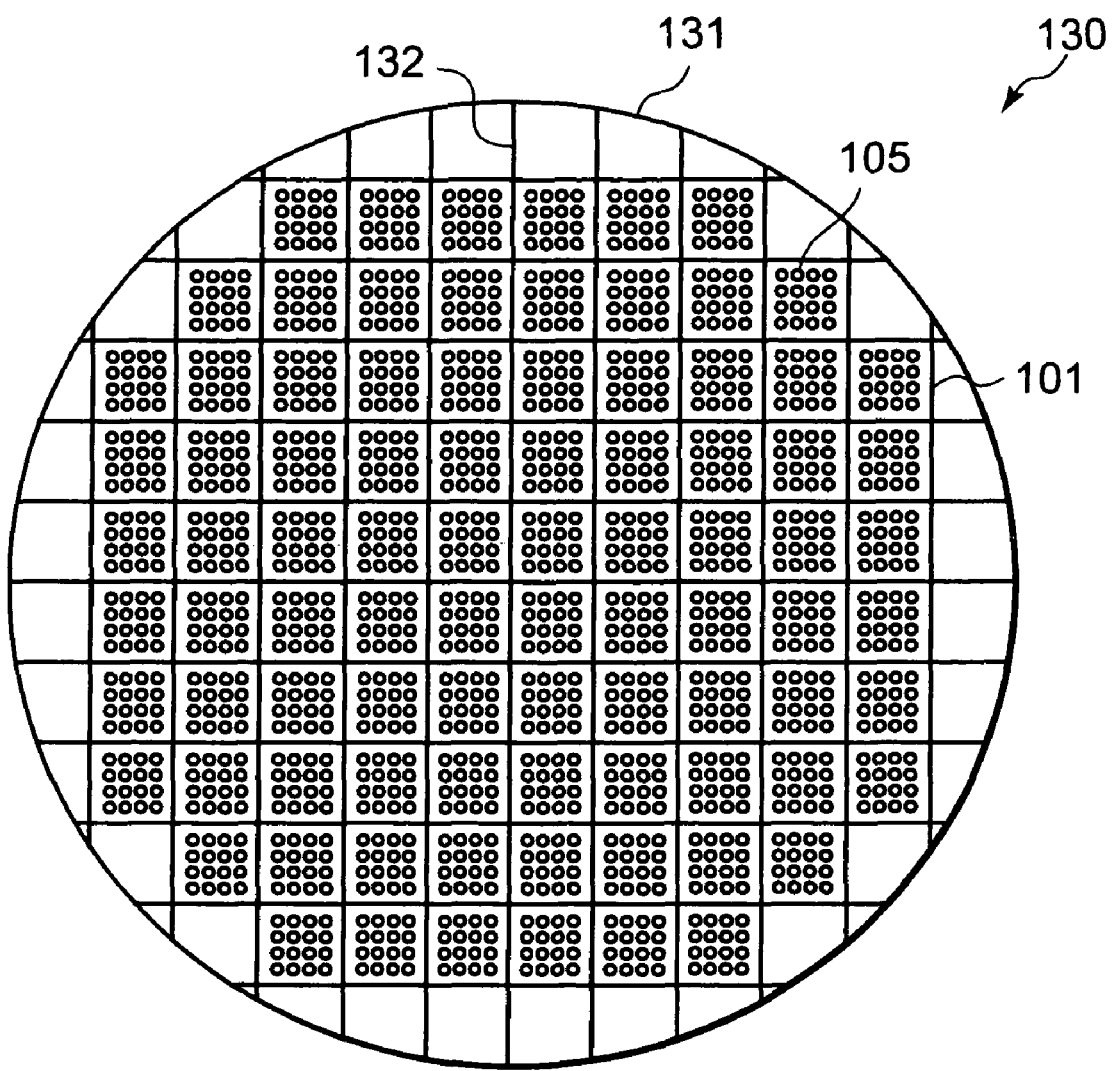
FIG. 3 is a plan schematic diagram of a WLBGA related to the first embodiment of the present invention.

Next, a method of fabricating a semiconductor device related to the present embodiment will be described. A known fabrication method is adopted to make a WLBGA 130 as FIG. 3 illustrates. FIG. 3 is an entire plan diagram taken from the side of the external connection terminals 105. The external connection terminals 105 are formed on a semiconductor wafer 131. Individual chips of the semiconductor device 101 will get separated each other by scribe lines 132.

FIG. 4 illustrates cross-sectional schematic diagrams of a process flow. FIG. 4A illustrates a part of the cross-sectional view of the WLBGA 130 illustrated in FIG. 3. Elements of the semiconductor wafer 131 are formed by known methods. The wiring layer 104 of the WLBGA 130 is formed on one side of the semiconductor wafer 131 by a known method. The external connection terminals (solder balls) 105 are formed through the relevant wiring layer 104.

Figure 4A:
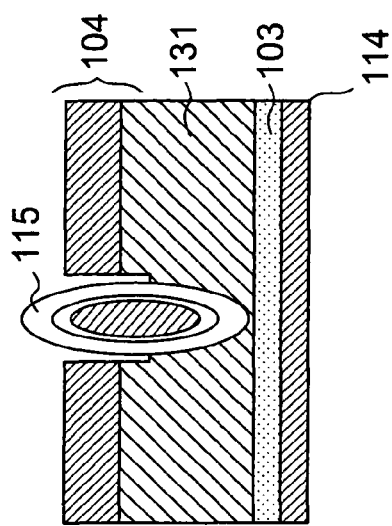
FIGS. 4A to 4F are cross-sectional schematic diagrams of a process flow related to the first embodiment of the present invention.
Figure 4B:
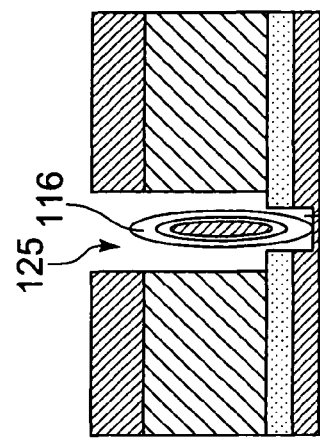

Next, the cover layer 103 is formed on the other side of the semiconductor wafer 104 as FIG. 4B illustrates. The cover layer is formed, for example, by applying a resin layer and pasting a tape layer. The cover layer 103 in the present embodiment was formed after forming the external connecting terminals 105. On the contrary, the cover layer 103 can be formed on one side of the external connecting terminals 105 after forming the cover layer 103 on the other side of the semiconductor wafer.

Figure 4C:
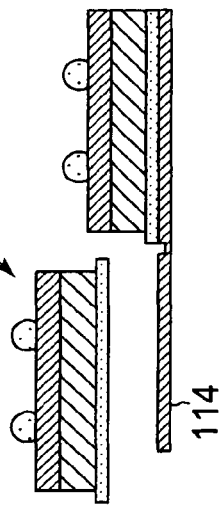

As FIG. 4C illustrates, the WLBGA 130 is pasted on the dicing tape 114 for dicing with its external connecting terminals 105 being arranged on its upper side. Individual chips of the WLBGA130 are produced with a blade 115 in the present embodiment.

Figure 4D:
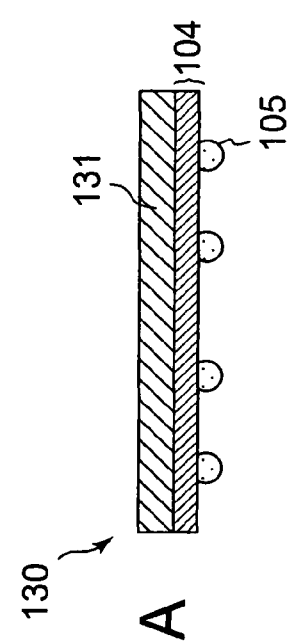
Figure 4E:
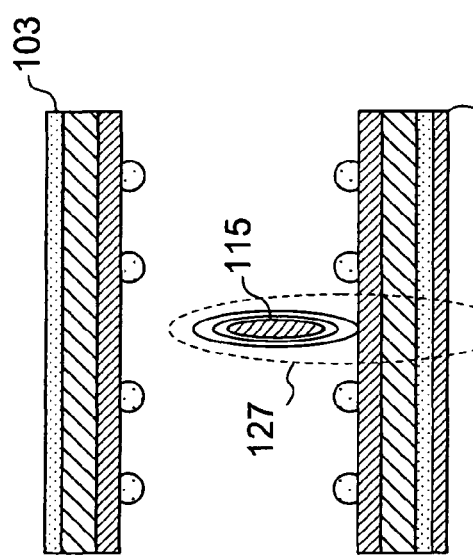

FIG. 4D and FIG. 4E illustrate the dicing portion specified by a circle 127 in FIG. 4C in an expanded manner in order to describe the dicing process. At first, as FIG. 4D illustrates, a first groove 125 is formed in one side (the surface where the external connecting terminals 105 are formed) of the semiconductor wafer 131 with a first blade 115. The first groove 125 is formed to reach the interface between the semiconductor wafer 131 and the cover layer 103.

Figure 4F:
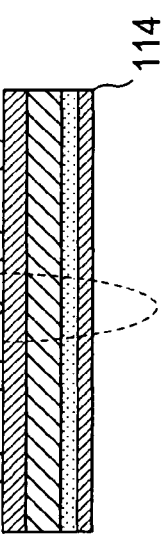

Next, as FIG. 4E illustrates, a second groove 121 for cutting the cover layer 103 is formed from the center of the bottom side of the first groove 125 with a second blade 116. Here, the width of the second blade 116 is narrower than the width of the first blade 115. That is, the width of the second groove 126 is narrower than the width of the first groove 125. The protruding portion of the cover layer 103 from the ridge line portion of the semiconductor chip 102 is determined by the difference in width between the first groove 125 and the second groove 126. Therefore, selecting those grooves arbitrarily, the protruding portion can be adjusted to attain a predetermined value. Thereafter, the individual chips of the semiconductor device 101 are peeled off from the dicing sheet 114 and picked up as FIG. 4F illustrates.

FIG. 5 illustrates schematic diagrams detailing a dicing process to illustrate an embodiment in the case where the protruding portion from the ridge line portion of the semiconductor chip 102 of the cover layer 103 is designed to be 7.5 µm. FIG. 5A is a step of forming a first groove with the first blade; FIG. 5B is a step of forming a second groove with the second blade; and FIG. 5C is a cross-sectional schematic diagram after the dicing process. FIG. 5D illustrates a plan view of a scribe line crossing in the WLBGA.

As FIG. 5A illustrates, the first groove 125 is formed from the surface where the external connecting terminals 105 are formed to the interface between the semiconductor wafer 131 and the cover layer 103 with the first blade 115 with the 50-µm blade width 117, aiming at the center of the 80-µm scribe line width 119. In that case, the side surfaces of the blade 115 are provided with micro grinding stone (not illustrated in the drawing). Therefore, the first groove width 120 after dicing is slightly wider than the blade width and will be approximately 55 µm (FIG. 5B). Next, as FIG. 5B illustrates, the second groove 126 is formed to cut the cover layer 103 from the bottom side of the first groove 125 with the second dicing blade 116 with 35-μm blade width 118. In that case, due to the grinding stone (not illustrated in the drawing) on the blade side surfaces, the second groove width 121 is slightly wider and is approximately 40 μm (FIG. 5C). FIG. 5C is a cross-sectional diagram after the dicing process. Thus, the difference in width between the first groove 125 and the second groove 126 can make a semiconductor device including the protruding portion 122 with the designed dimension being 7.5 μm.

FIG. 5D is a plan diagram of the individual chips of the semiconductor device 101 before being picked up. The cover layer 103 protrudes 7.5-μm outer (the protruding portion 122) than the ridge line portion 107 of the semiconductor chip 102, that is, toward the scribe line side.

The semiconductor device 101 manufactured by such a method will be structured as FIG. 1 illustrates so that the cover layer formed on the other side of the semiconductor chip is outside of the ridge line portion of the above described semiconductor chip. Therefore, at the occasion of handling, the ridge line portion of a semiconductor chip will no longer directly contact to, for example, a jig for handling. Since ridge line portions of semiconductor chips are protected, chipping occurring there can be restrained.

Second Embodiment

The embodiment hereof is different from the other embodiments in the protruding mode at the end portion 106 of the cover layer.

Figure 6:
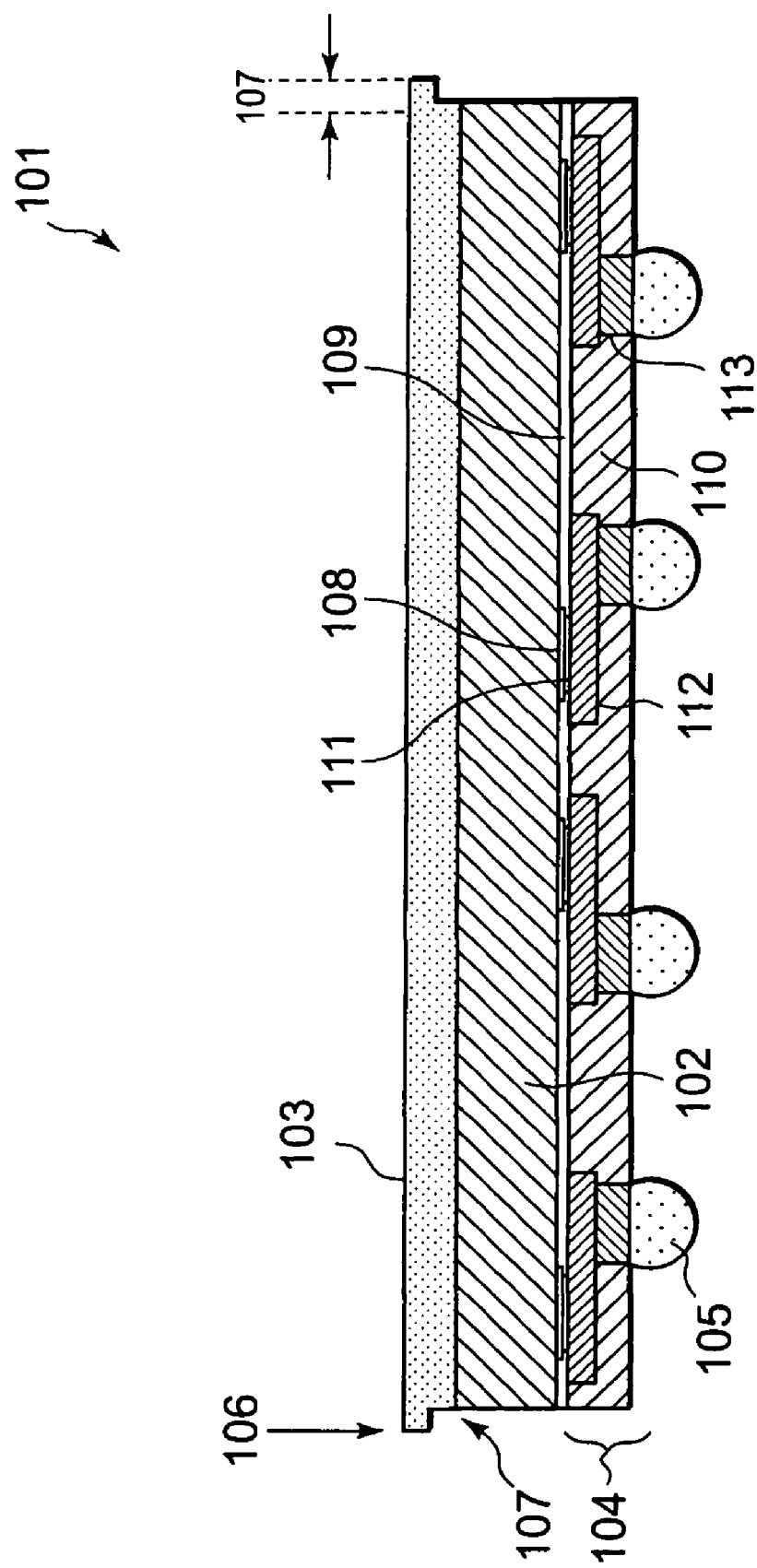
FIG. 6 is a cross-sectional schematic diagram of a semiconductor device related to a second embodiment of the present invention.

FIG. 6 is a cross-sectional schematic diagram of a semiconductor device related to the second embodiment of the present invention. The second embodiment is different from the first embodiment (FIG. 1) in that a part of the end portion 106 of the cover layer of the semiconductor chip 102 is outside of a ridge line portion 107 of the semiconductor chip. Since a part of the cover layer 103 is outside of the ridge line portion 107 of the semiconductor chip, the second embodiment gives rise to the effect similar to the first embodiment.

FIG. 7 illustrates cross-sectional schematic diagrams on a method of fabricating a semiconductor device related to the second embodiment.

As FIG. 7A illustrates, a conventional WLBGA 130 is produced by a known fabrication method. In the WLBGA 130, external connecting terminals (solder balls) 105 are formed on one side of the semiconductor wafer 131 through a wiring layer 104.

Next, as FIG. 7B illustrates, a cover layer 103 is formed on the other side of the semiconductor wafer 131. Pasting a dicing tape 114 on the surface of the cover layer 103 as FIG. 7C illustrates, a blade 115 makes individual pieces from the WLBGA 130.

FIG. 7D and FIG. 7E illustrate the dicing portion specified by a circle 127 in FIG. 7C in an expanded manner in order to describe the dicing process. At first, as FIG. 7D illustrates, a first groove 125 is formed in one side (the surface where the external connecting terminals 105 are formed) of the semiconductor wafer 131 with a first blade 115. The first groove 125 is formed to reach the middle of the cover layer 103 through the semiconductor wafer 131. Since the residual film of the cover layer at that time corresponds to thickness of the protrusion, depth of the first groove 125 can be appropriately adjusted so as to attain a predetermined thickness.

Next, as FIG. 7E illustrates, a second groove 126 for cutting the cover layer 103 is formed from the center of the bottom side of the first groove 125 with a second blade 116.

Here, the width of the second blade 116 is narrower than the width of the first blade 115. That is, the width of the second groove 126 is narrower than the width of the first groove 125. The protruding portion of the cover layer 103 from the ridge line portion of the semiconductor chip 102 is determined by the difference in width between the first groove 125 and the second groove 126. Therefore, selecting those grooves arbitrarily, the protruding portion can be adjusted to attain a predetermined value. Thereafter, the individual chips of the semiconductor device 101 are peeled off from the dicing sheet 114 and picked up as FIG. 7F illustrates.

The semiconductor device 101 fabricated by such a method will be structured as FIG. 6 illustrates, giving rise to an effect of restraining chipping.

Third Embodiment

The embodiment hereof is different from the other embodiments in that a cover layer is formed so as to cover ridge line portions of the semiconductor chips.

Unlike the semiconductor device 101 in the first embodiment or the second embodiment (FIG. 1 or FIG. 6), by applying heat treatment to the end portion of the cover layer 103, the cover layer 103 can be formed to cover the ridge line portion 107 in the semiconductor chips 102.

Figure 8:
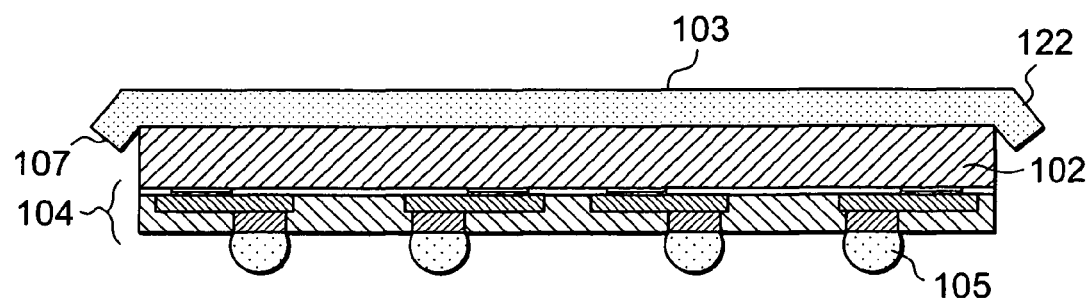
FIG. 8 is a cross-sectional schematic diagram of a semiconductor device related to a third embodiment of the present invention.

According to conditions of heat treatment, the cover layer 103 can be bent in the direction of the side where the external connecting terminals 105 of the semiconductor device 101 so as to cover the ridge line portions 107 of the semiconductor chips 102 as FIG. 8 illustrates.

Figure 9:
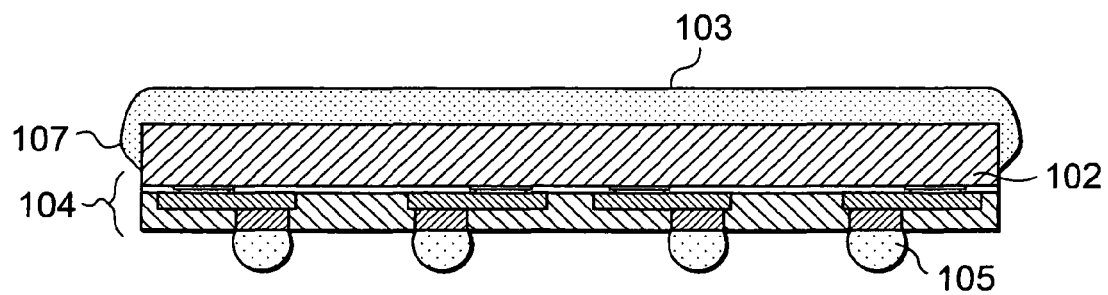
FIG. 9 is a cross-sectional schematic diagram of a semiconductor device related to the third embodiment of the present invention.
Figure 11:
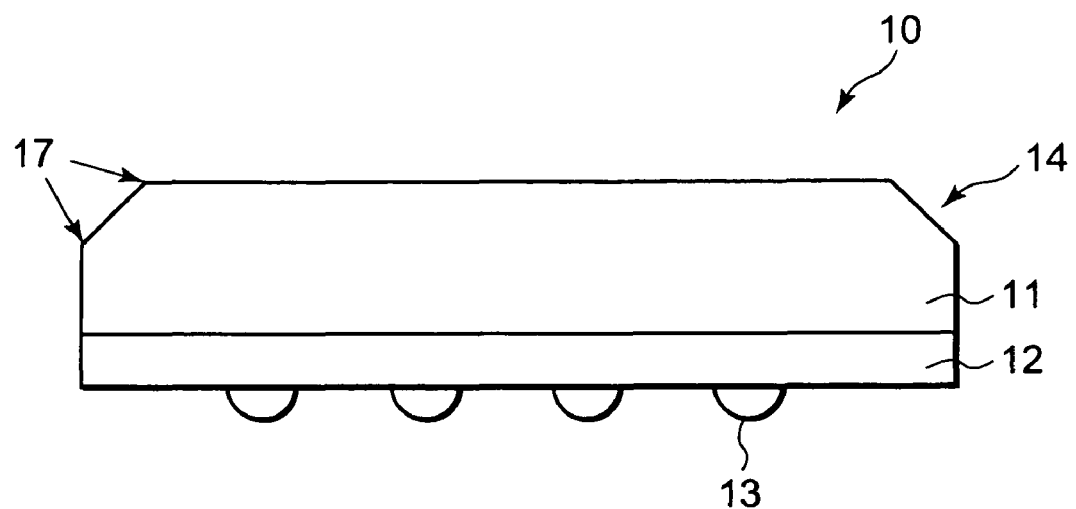
FIG. 11 is a diagram for describing prior art of the present invention.
Figure 12:
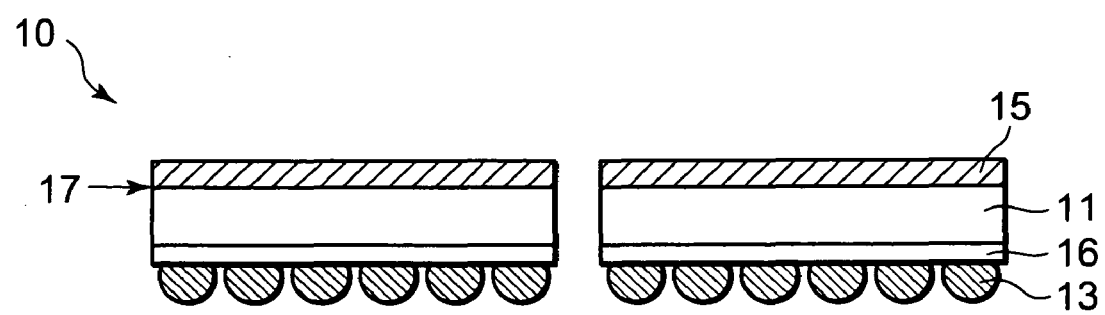
FIG. 12 illustrates diagrams for describing prior art of the present invention.

As structured in FIG. 9, infrared heating (not illustrated in the drawing) can locally overheat end portions of the cover layer 103 to melt so as to cause the cover layer 103 to cover the ridge line portions 107 of the semiconductor chips 102 and contact to their side surfaces.

The present embodiment can restrain occurrence of chipping more effectively since the cover layer 103 covers the ridge line portions 107 of the semiconductor chips 102.

Fourth Embodiment

The embodiment hereof is different from the other embodiments in the method of forming the cover layer.

FIG. 10 illustrates cross-sectional schematic diagrams on a method of fabricating a semiconductor device related to a fourth embodiment.

As FIG. 10A illustrates, for example, a conventional WLBGA 130 is produced by a known fabrication method. In the WLBGA 130, external connecting terminals (solder balls) 105 are formed on one side of the semiconductor wafer 131 through a wiring layer 104.

Next, as FIG. 10B illustrates, a dicing tape (double layer structure) 124 made by stacking a cover layer and a dicing tape is used. The other side of the semiconductor wafer 131 is pasted on the side where the cover layer of the relevant dicing tape is formed.

As FIG. 10C illustrates, a blade 115 makes individual pieces from the WLBGA 130 in the present embodiment. FIG. 10D and FIG. 10E illustrate the dicing portion specified by a circle 127 in FIG. 10C in an expanded manner in order to describe the cutting process.

At first, as FIG. 10D illustrates, a first groove 125 is formed in one side (the surface where the external connecting terminals 105 are formed) of the semiconductor wafer 131 with a first blade 115. The first groove 125 is formed to reach the interface between the semiconductor wafer 131 and the cover layer 104.

Next, as FIG. 10E illustrates, a second groove 126 for cutting the cover layer 103 is formed from the center of the bottom side of the first groove 125 with a second blade 116. Here, the width of the second blade 116 is narrower than the width of the first blade 115. That is, the width of the second groove 126 is narrower than the width of the first groove 125. The protruding portion of the cover layer 103 from the ridge line portion of the semiconductor chip 102 is determined by the difference in width between the first groove 125 and the second groove 126. Therefore, selecting those grooves arbitrarily, the protruding portion can be adjusted to attain a predetermined value.

Thereafter, the individual chips of the semiconductor device 101 are peeled off from the cover layer 103 and the dicing sheet and picked up as FIG. 10F illustrates.

Here, for the above described respective embodiments, examples of forming the first groove and the second groove by blade dicing were described. However, laser dicing with laser can be used to form those grooves instead of blade dicing. In addition, the two methods can be used in a composite manner such as forming the first groove by blade dicing and forming the second groove by laser dicing (or forming the second groove by blade dicing and forming the first groove by laser dicing).

What is claimed is:

1. A semiconductor device, comprising: a semiconductor chip; at least one external connecting terminal formed on one side of the semiconductor chip; and a cover layer formed on another side of the semiconductor chip, wherein a part of an end portion of the cover layer protrudes outside of a ridge line portion of the semiconductor chip, wherein, in a plan view, a wiring layer formed between the one side of the semiconductor chip and the at least one external connecting terminal has substantially a same size as the semiconductor chip, and wherein, in the plan view, the part of the end portion of the cover layer protrudes outside of the wiring layer, and wherein the semiconductor chip spaces apart an entire surface of the wiring layer from the cover layer.

2. The semiconductor device according to claim 1, wherein the cover layer is formed so as to cover the ridge line portion of the semiconductor chip.

3. The semiconductor device according to claim 1, wherein a bonding pad is formed on the one side of the semiconductor chip and is respectively connected to each of the at least one external connecting terminal.

4. The semiconductor device according to claim 1, wherein the cover layer has a planar shape.

5. The semiconductor device according to claim 1, wherein, in the plan view, the wiring layer extends up to the ridge line portion of the semiconductor chip.

6. The semiconductor device according to claim 1, wherein the semiconductor chip spaces apart the wiring layer from the cover layer.

7. The semiconductor device according to claim 1, wherein a bonding pad attached to the one side of the semiconductor chip is connected to the external connecting terminal through the wiring layer.

8. A semiconductor device, comprising:
a semiconductor chip;
at least one external connecting terminal formed on one side of the semiconductor chip; and
a cover layer formed on another side of the semiconductor chip,
wherein a part of an end portion of the cover layer protrudes outside of a ridge line portion of the semiconductor chip,
wherein, in a plan view, a wiring layer formed between the one side of the semiconductor chip and the at least one external connecting terminal has substantially a same size as the semiconductor chip, and
wherein the semiconductor chip spaces apart an entire surface of the wiring layer from the cover layer.

* * * * *